United States Patent
Sinnreich et al.

(10) Patent No.: US 10,221,535 B2
(45) Date of Patent: Mar. 5, 2019

(54) DEVICE AND METHOD FOR GATHERING DATA TO MODEL THE LATERAL LOAD RESPONSE CHARACTERIZATION OF A PILE

(71) Applicant: Loadtest, Inc., Gainesville, FL (US)

(72) Inventors: Jon Sinnreich, Gainesville, FL (US); Denton A. Kort, Gainesville, FL (US)

(73) Assignee: LOADTEST, Gainesville, FL (US)

( * ) Notice: Subject to any disclaimer, the term of this patent is extended or adjusted under 35 U.S.C. 154(b) by 157 days.

(21) Appl. No.: 15/150,083

(22) Filed: May 9, 2016

(65) Prior Publication Data

US 2016/0326708 A1    Nov. 10, 2016

Related U.S. Application Data

(60) Provisional application No. 62/158,273, filed on May 7, 2015.

(51) Int. Cl.
| | |
|---|---|
| *G06F 17/50* | (2006.01) |
| *E02D 1/02* | (2006.01) |
| *E21B 47/06* | (2012.01) |

(52) U.S. Cl.
CPC .............. *E02D 1/022* (2013.01); *E21B 47/06* (2013.01); *G06F 17/5009* (2013.01)

(58) Field of Classification Search
USPC .................. 703/1, 6; 175/156; 405/229, 231
See application file for complete search history.

(56) References Cited

U.S. PATENT DOCUMENTS

| | | |
|---|---|---|
| 3,446,062 A | 5/1969 | Goodman et al. |
| 3,961,524 A | 7/1976 | de la Cruz |
| | (Continued) | |

OTHER PUBLICATIONS

O'Neill, Michael W. et al., "Analysis of Axial and Lateral Drilled Shaft Socket Load Tests and Axial Pile Load Tests for Foundation for T.H. 36 Bridge Over the St. Croix River, Stillwater, Minnesota," *Minnesota Department of Transportation Report*, Jan. 1996, pp. 1-122.

(Continued)

*Primary Examiner* — Thai Phan
(74) *Attorney, Agent, or Firm* — Saliwanchik, Lloyd & Eisenschenk

(57) ABSTRACT

Embodiments relate to an apparatus and method for performing a split-lateral load test. Embodiments use a double hydraulic jack to apply two lateral loads, having equal magnitudes and opposite directions, to the soil layer of an excavation for a deep foundation element. Data such as the magnitude of the lateral load and magnitude of the displacement of the loading mechanism upon application of the lateral load can be measured and/or recorded. Embodiments can yield soil modulus ($E_s$) information in a form analogous to a p-y curve, which can be used to design a pile structure and pile placement, and model a pile response to lateral loading using computer software. Embodiments do not require the casting of concrete, and allow the split lateral loading mechanism to be sequentially positioned, and apply lateral loads, at multiple depths in an excavation. Embodiments simultaneously apply bi-directional lateral loads at multiple depths in an excavation.

20 Claims, 13 Drawing Sheets

(56) References Cited

U.S. PATENT DOCUMENTS

| | | | |
|---|---|---|---|
| 4,043,186 A | 8/1977 | Marchetti | |
| 4,461,171 A | 7/1984 | de la Cruz | |
| 8,776,583 B2 | 7/2014 | Marchetti | |
| 8,925,648 B2* | 1/2015 | Lucon | E21B 44/00 |
| | | | 175/56 |
| 2007/0092341 A1* | 4/2007 | Schmertmann | E02D 27/16 |
| | | | 405/231 |
| 2012/0003051 A1* | 1/2012 | Plotkin | E02D 5/56 |
| | | | 405/229 |
| 2015/0276702 A1* | 10/2015 | England | G01N 33/383 |
| | | | 374/4 |

OTHER PUBLICATIONS

Kahle, Kevin James et al., "Performance of Laterally Loaded Drilled Sockets Founded in Weathered Quartzite," Auburn University, Master's Thesis, Nov. 2002, pp. 1-242.

Wang, Shih-Tower et al., "COM624P—Laterally Loaded Pile Analysis Program for the Microcomputer, Version 2.0," U.S. DOT Federal Highway Administration, Report No. FHWA-SA-91-048, Aug. 1993, pp. 1-511.

* cited by examiner

DEVICE AND METHOD FOR GATHERING DATA TO MODEL THE LATERAL LOAD RESPONSE CHARACTERIZATION OF A PILE

CROSS-REFERENCE TO A RELATED APPLICATION

This application claims the benefit of U.S. Provisional Application Ser. No. 62/158,273, filed May 7, 2015 which is hereby incorporated by reference in its entirety, including any figures, tables, or drawings.

BACKGROUND

A family of devices exists that are designed to be lowered into exploratory boreholes, which are typically 3 inches diameter, to ascertain soil and/or rock modulus properties of the soil and/or rock surrounding the exploratory borehole. These exploratory boreholes can be larger or smaller than 3 inches (76 mm), but are generally not greater than 6 inches (152 mm). Examples of such devices designed to be lowered into exploratory boreholes include:

the Goodman Jack (U.S. Pat. No. 3,446,062) and derivatives (e.g., U.S. Pat. No. 3,961,524), which are lowered into an exploratory borehole to measure the modulus of soil and/or rock by application of two forces in two opposing directions;

flat-plate dilatometers (e.g., U.S. Pat. No. 4,043,186), and derivatives (e.g., U.S. Pat. No. 8,776,583), which are first pushed into a soil mass and then activated, in order to measure the modulus of soil in one direction by transverse inflation of a flat, flexible membrane; and pressure meters, which are lowered into an exploratory borehole to measure the modulus of soil and/or rock by radial expansion of an inflatable chamber.

These devices designed to be lowered into exploratory boreholes typically embody two primary characteristics. First, the devices are relatively small in cross-sectional dimension, i.e., typically less than 3 inches (76 mm), in order to fit into a standard-size exploratory borehole, i.e., 3 inches (76 mm). Second, the active maximum displacement of such devices into the soil and/or rock is minimal, e.g., typically fractions of an inch. Therefore, these devices are effective in ascertaining either elastic modulus (pounds per square inch) or bulk modulus (pounds per cubic inch) of the surrounding soil and/or rock, within a small stress field. Modulus, such as elastic modulus and bulk modulus, is a property of material typically ascertained at very small deformations of the material.

A sacrificial split-lateral test was first described by O'Neill and Majano (1995). Split-lateral testing using a sacrificial hydraulic O-cell jack, such as a sacrificial hydraulic O-cell jack cast into a drilled shaft element has been performed on several projects in North America. Brown and Camp (2000) used assemblies with two sacrificial (O-Cell™) jacks each. Additionally, Kahne and Brown (2002) used a system with a retrievable hydraulic (O-Cell™) jack, positioned in an access way cast into the shaft, but the hydraulic jack was able to load the shaft at only one location. These innovations, though commercially available for 20 years, were never patented.

U.S. Pat. No. 4,461,171 is directed to a device to determine the in-situ deformability of rock mass.

BRIEF SUMMARY

Embodiments relate to an apparatus and method for performing a split-lateral test. Specific embodiments can use one or more hydraulic jacks (e.g., incorporating an Osterberg cell (O-Cell™) jack assembly) that apply two equal and opposite loads to a corresponding two bearing plates, to test the lateral soil stiffness with respect to soil adjunct to a portion of an excavation for a deep foundation element, such as a cast-in-place pile. Specific embodiments of the apparatus and method for performing an apparatus and method for performing a split-lateral test are analogous to the bi-directional axial test, such as the Osterberg Cell™ (O-Cell™) jack assembly bi-directional axial test apparatus, in that such implementations of the split-lateral test apply a lateral load directly to the soil layer of interest, rather than applying the lateral load at the pile head and transmitting the lateral load via the pile structure through overburden to the bearing layer. Specific embodiments of the apparatus and method for performing a split-lateral load test apply two lateral loads, having equal magnitudes, and opposite directions, to the soil layer of interest.

Data, such as the magnitude of the lateral load and the magnitude of the displacement of the load applying mechanism (e.g., hydraulic jack), as a function of time, at certain points in time, at certain lateral force magnitudes, and/or upon one or more inflection points of the magnitude of the displacement as a function of the magnitude of the lateral force, can be measured and/or recorded. Various loading protocols can be implemented such as applying n loads for n load intervals, e.g., a first pressure for a first period of time, applying a second pressure for a second period of time, . . . , and applying an nth pressure for an nth period of time, where (i) the load increases each load interval until a maximum load is reached and the periods of time (e.g., 10 minutes or 20 minutes) are the same, or (ii) where the periods of time are the times needed for the change in displacement per hour to fall below a threshold, such that the loading is terminated upon a maximum load being reached or until a load is reached where the threshold change in displacement per hour is not obtain after a sufficiently long time. Specific embodiments can apply a load regimen that produces results analogous to the results produced by implementing loads in accordance with the ASTM D3966 standard for piles under lateral loads applied a the head of the pile.

Embodiments of the apparatus and method for performing a split-lateral test can yield valuable soil modulus ($E_s$) information in a form analogous to a p-y curve, which can be used to design a pile structure and/or pile placement, and which can be used to model pile response to lateral loading, e.g., via computer software (e.g., as taught by Wang and Reese 1993), where the teaching of the Wang and Reese reference [ref. 3] regarding modeling pile response to lateral loading are hereby incorporated by reference into the subject application.

Similar to the standard bi-directional axial test, such as the axial test using an Osterberg Cell™ jack assembly, specific implementations of the split-lateral test do not require an external reaction system and, thus, can be an efficient testing method, especially in offshore applications (e.g., where structures are used to keep water away from the excavation opening where the excavation opening in below sea level) and/or with respect to large diameter piles. Specific embodiments of the apparatus and method for performing a split-lateral test do not require the casting of any concrete, and allow the split lateral load assembly to be positioned at multiple desired depths in an excavation to test the lateral bearing capacity of the various strata. Specific embodiments of the split-lateral load assembly can be used to simultaneously apply bi-directional lateral loads at multiple desired depths in an excavation via multiple lateral load applying mechanisms. Specific embodiments of the split-lateral load assembly can be used to sequentially apply bi-directional lateral loads at multiple desired depths in an excavation by sequentially positioning a single lateral load applying mechanism at multiple depths and applying lateral loads at each depth.

DETAILED DESCRIPTION

Figure 1A:
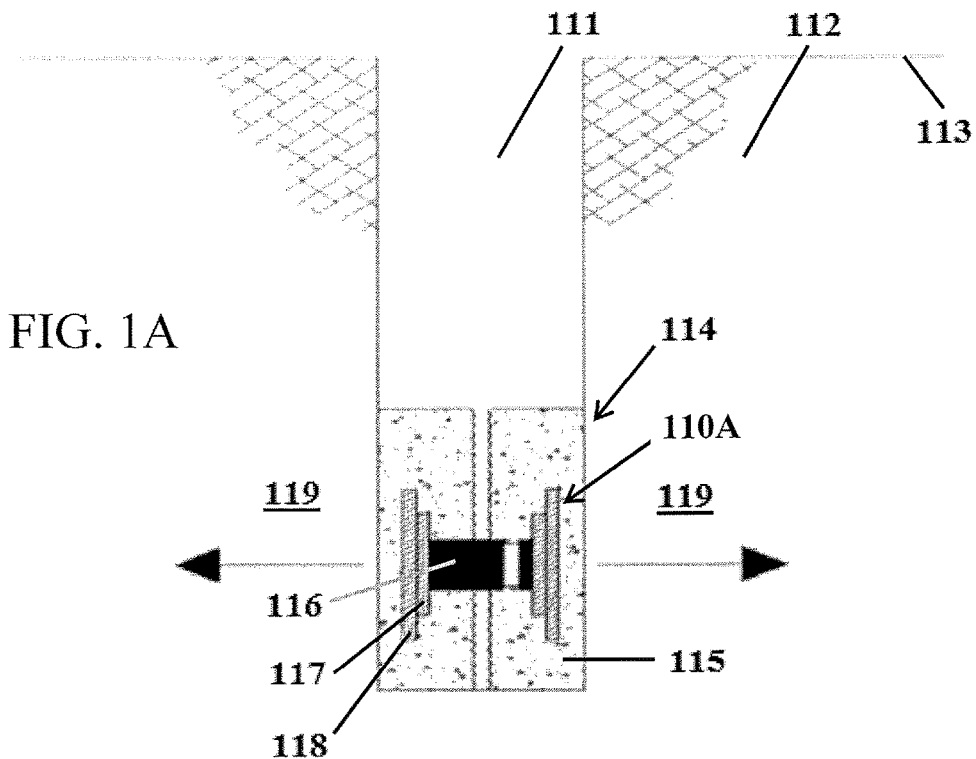
FIG. 1A shows a schematic of an implementation of the split-lateral load test using a sacrificial split-lateral load test assembly.

Embodiments relate to an apparatus and method for performing a split-lateral test. Specific embodiments can use a double hydraulic jack (e.g., incorporating an Osterberg cell (O-Cell™) jack assembly) to test the lateral soil stiffness with respect to a deep foundation element, such as a cast-in-place pile. Specific embodiments of the apparatus and method for performing a split-lateral test are analogous to the bi-directional axial test, such as the Osterberg Cell™ (O-Cell™) jack assembly bi-directional axial test apparatus, in that such implementations of the split-lateral test apply a lateral load directly to the soil layer of interest, rather than applying the lateral load at the pile head and transmitting the lateral load via the pile structure through overburden to the bearing layer. Specific embodiments of the apparatus and method for performing a split-lateral load test apply two lateral loads, having equal magnitudes, and opposite directions, to the soil layer of interest. Data, such as the magnitude of the lateral load and the magnitude of the displacement of the load applying mechanism, as a function of time, at certain points in time, at certain lateral force magnitudes, and/or upon one or more inflection points of the magnitude of the displacement as a function of the magnitude of the lateral force, can be measured and/or recorded.

Embodiments of the apparatus and method for performing a split-lateral test can yield valuable soil modulus ($E_s$) information in a form analogous to a p-y curve, which can be used to design a pile structure and/or pile placement, and which can be used to model pile response to lateral loading, e.g., via computer software (e.g., as taught by Wang and Reese 1993), where the teaching of the Wang and Reese reference [ref. 3] regarding modeling pile response to lateral loading are hereby incorporated by reference into the subject application.

Similar to the standard bi-directional axial test, such as the axial test using an Osterberg Cell™ jack assembly, specific implementations of the split-lateral test do not require an external reaction system and, thus, can be an efficient testing method, especially in offshore applications and/or with respect to large diameter piles. Specific embodiments of the apparatus and method for performing a split-lateral test do not require the casting of any concrete, and allow the split lateral load assembly to be positioned at multiple desired depths in an excavation to test the lateral bearing capacity of the various strata. Specific embodiments of the split-lateral load assembly can be used to simultaneously apply bi-directional lateral loads at multiple desired depths in an excavation via multiple lateral load applying mechanisms. Specific embodiments of the split-lateral load assembly can be used to sequentially apply bi-directional lateral loads at multiple desired depths in an excavation by sequentially positioning a single lateral load applying mechanism at multiple depths and applying lateral loads at each depth. Embodiments of a full-scale, large-displacement split-lateral load test assembly have advantages as compared to typical exploratory borehole devices, such as the Goodman Jack, flat-plate dilatometers, and pressure meters. Embodiments of the subject lateral load test assembly can be used in deep foundation excavations. Specific embodiments relate to an apparatus and method for use in deep foundation excavations having diameters ranging in the range of 24 to 120, 36-120, 48-120, 60-120, 60-72, 60-84, 60-96, and/or 60-108 inches. Specific embodiments relate to an apparatus and method for use in deep foundation excavations having diameters greater than 6, 8, 10, 12, 18, 24, 30, 36, 42, 48, 54, 60, 66, 72, 78, 84, 90, 96, 102, 108, 114, and/or 120 inches.

Due to the substantial difference between the diameters of such excavations (e.g., 24 to 120 inches) and exploratory boreholes, which typically have a 3-inch diameter, the side walls of such excavations are able to relax an existing stress state of the side wall, such as an existing stress state after completion of the excavation, by swelling into the open excavation (without necessarily collapsing). Embodiments of the subject split-lateral load device are able to re-compress this swelled soil back to the soil's original position, then compress the soil further, into a compressed state, and, if desired, compress the soil until an ultimate capacity of the soil is reached. For some soils, a displacement of the load applying mechanism of 6 inches or more may be needed, in order to generate a fully developed p-y curve.

In contrast, arching action in a small-diameter, e.g., 3 in (76 mm) exploratory borehole prevents the sidewall from swelling significantly, and the assessment of initial soil or rock modulus requires only a very small displacement of soil, e.g., less than an inch, and the soil and/or rock modulus is measured in different engineering units.

Additionally, in contrast with the typical exploratory borehole devices, embodiments of the subject apparatus and method for performing a split-lateral load test engage a substantial portion of the full semi-circular cross section of the soil and/or rock surrounding the excavation with the application of each unidirectional load, such that the lateral shear component of load resistance is incorporated into the data produced. Typical exploratory borehole devices engage the rock or soil mass in normal bearing pressure only. The Goodman Jack bearing plates consist of 90° arcs, the dilatometer devices use a nominally flat plate, and the pressure meter devices expand uniformly in all radial directions.

Embodiments of the subject split-lateral load test assembly are enhanced by use of a double-acting (e.g., expand and contract) hydraulic cylinder, which permits the active cycling of load, to simulate loads experienced by structures due to, for example, ocean waves, earthquakes, gusting winds, and vortex shedding in steady water currents. The p-y curves due to cyclic loading are recognized by the industry to be substantially different from those due to monotonically-increasing load (Reese et al. 1974), and embodiments that perform direct measurement of soil capacity under these load conditions, e.g., actively cycling loading, are advantageous. The teachings of active cycling of load, and generation of p-y curves due to cyclic loading, in the Reese et al. 1974 reference are hereby incorporated by reference in the subject application.

Figure 1B:
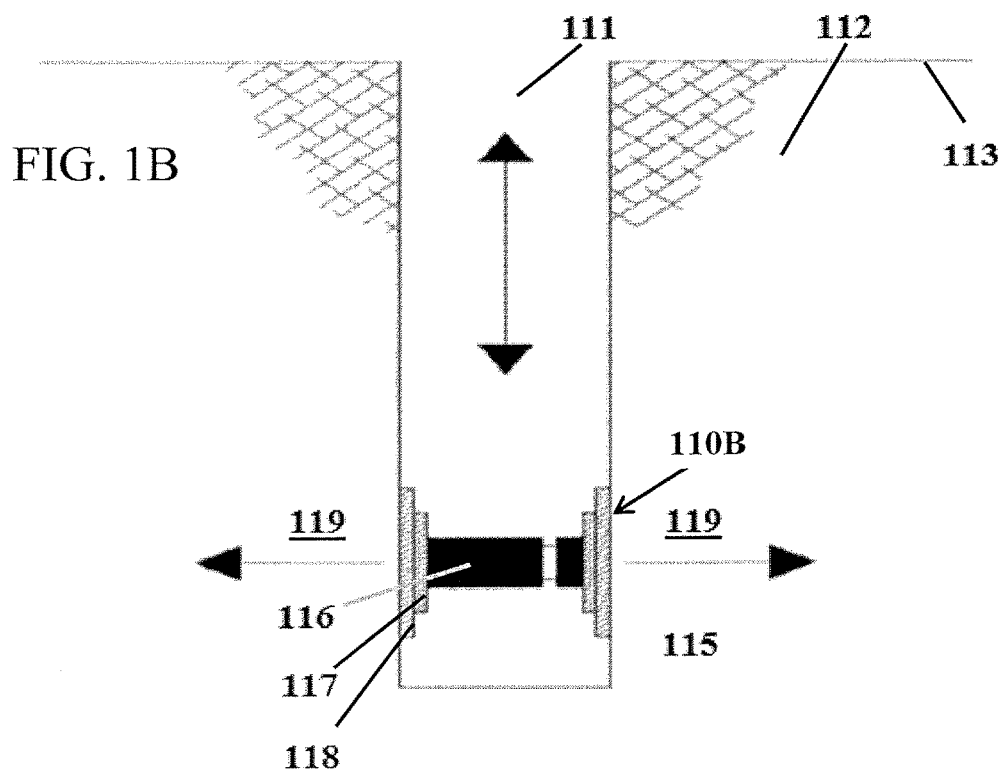
FIG. 1B shows a schematic of an implementation of the split-lateral load test using a retrievable split-lateral load test assembly.

Embodiments of the subject assembly using a retrievable split-lateral loading mechanism assembly, for example as shown in FIG. 1B, have advantages when compared to an assembly using a sacrificial split lateral loading mechanism 110A, for example as shown in FIG. 1A. Using a retrievable split-lateral loading mechanism 110B can allow the retrievable split-lateral loading mechanism to be sequentially positioned at multiple depths in an excavation and subsequently retrieved, where FIG. 1B shows an embodiment of a retrievable split-lateral loading mechanism positioned at one depth in an excavation. Using a retrievable split-lateral loading mechanism can result in a substantial increase in the amount of data collected via the loading mechanism. FIG. 1A shows a schematic of an implementation using a sacrificial split-lateral load test assembly using a sacrificial loading mechanism 110A encased in concrete 115 in accordance with an embodiment of the invention. FIG. 1B shows a schematic of an implementation using a retrievable split-lateral load test assembly using a retrievable loading mechanism 110B, in accordance with embodiments of the invention. Sacrificial loading mechanism 110A can be substantially identical in design as the retrievable loading mechanism 110B, and optionally have different dimensions, or can have a different design.

Figure 2A:
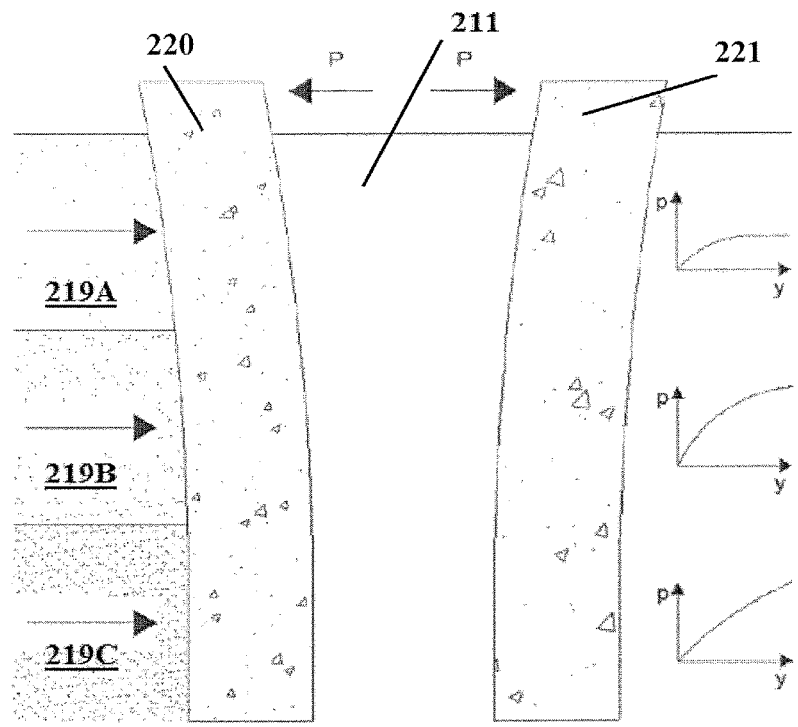
FIG. 2A shows an implementation of a traditional lateral load test.
Figure 2B:
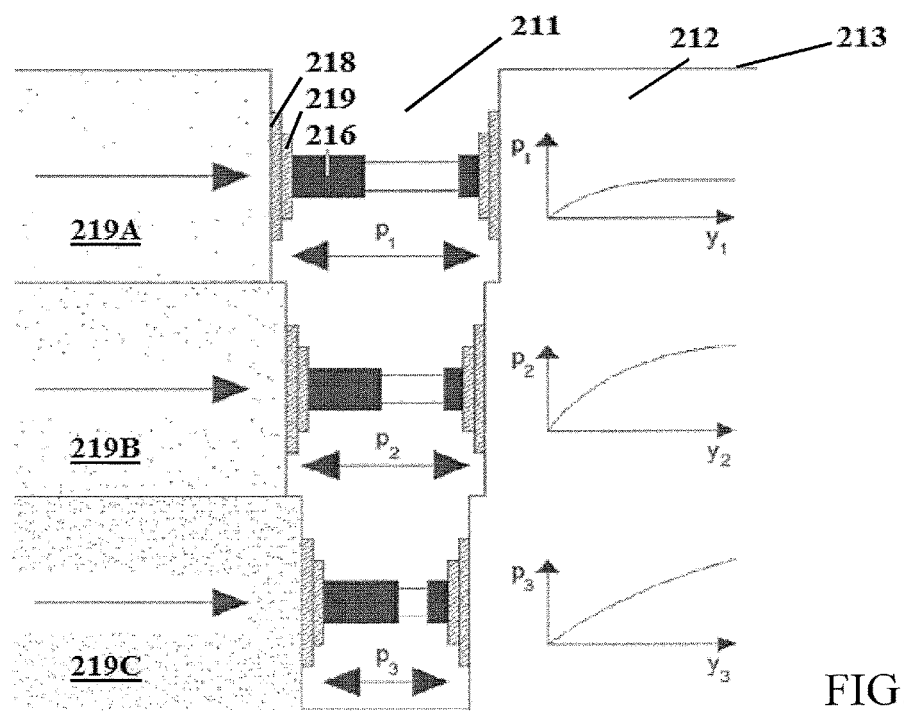
FIG. 2B shows an implementation of a split-lateral load test in accordance with an embodiment of the subject invention.

Embodiments can apply a lateral load directly to each soil layer of interest (e.g., as shown in FIG. 2B) and obtain the information of most interest to the engineer, without the need for an external reaction system (e.g., as shown in FIG. 2A). FIG. 2A shows an implementation of a traditional lateral load test, where a reaction system incorporating reaction pile 220 is used to apply a lateral load to the head of pile 221, where the loading mechanism is not shown other than arrows showing the direction of and location of application of the lateral load. FIG. 2B shows an implementation of a split-lateral load test in accordance with embodiments of the invention, where multiple bi-directional lateral loads are applied at multiple vertical locations in the excavation at the same time.

Embodiments can use the open-excavation retrievable split-lateral test assembly, and, by not having to cast any concrete, achieve substantial material cost and time savings. The load test can be conducted immediately after excavation, without the need to wait weeks for the concrete cast around a sacrificial loading mechanism to cure.

In an embodiment, combining (or "chaining") two, three, four, or more for the split-lateral load test assemblies together, a stress field similar to the one created by a pile in lateral loading via application of a lateral load to the head of the pile can be created in the soil.

Embodiments

1) Embodiments can use a cast-in-place sacrificial assembly a) Embodiments can use a sacrificial double-acting single jack assembly. A single jack can be placed in the center of the loading assembly. Mounting points between jack and bearing plates can allow for pivoting, so that bending moment is not induced into the jacks. The assembly can be instrumented to monitor the expansion of the jack, such as distance and pressure. Double-acting jacks can allow for cyclic loading.

b) Embodiments can use a sacrificial double-acting multiple jack assembly. Two or more jacks can be aligned one above the other in the loading assembly, where the jacks are pressurized independently, allowing the bearing plates to be maintained vertical. Mounting points between jacks and bearing plates can allow for pivoting, so that bending moment is not induced into the jacks. The assembly can be instrumented to monitor the expansion of each jack, such as distance and pressure, independently. Double-acting jacks can allow for cyclic loading.

Figure 3:
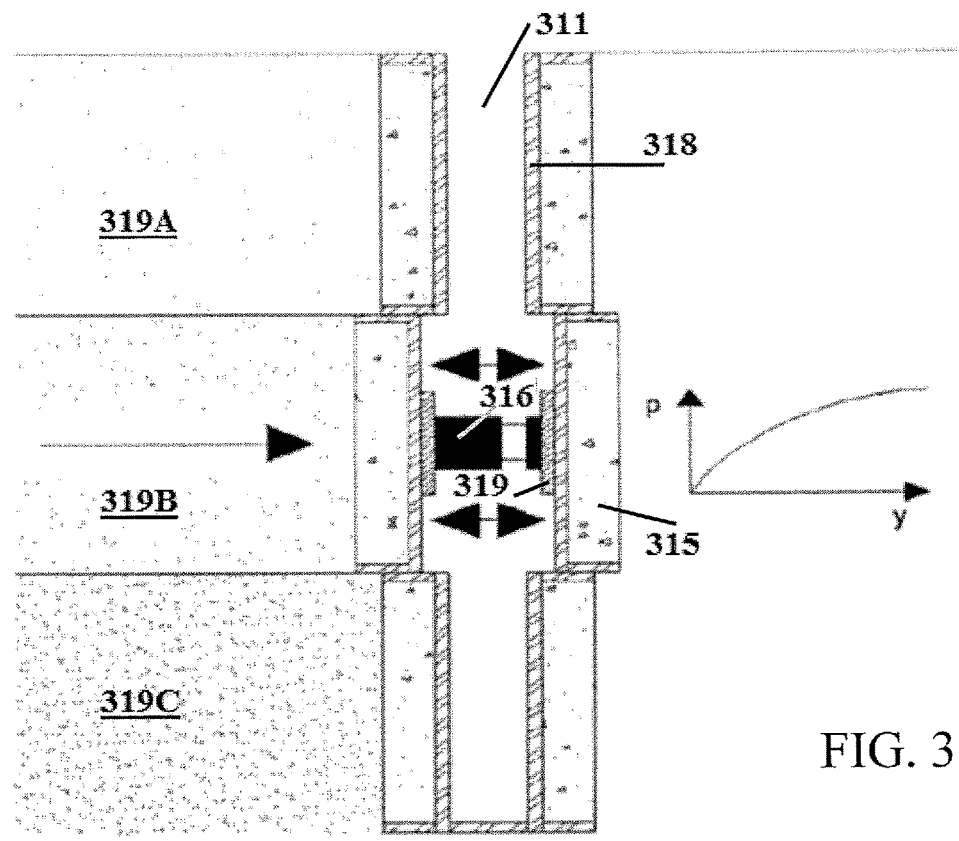
FIG. 3 shows a schematic of an implementation of a split-lateral load test using a multiple-separation access channel in accordance with an embodiment of the subject invention.
Figure 4:
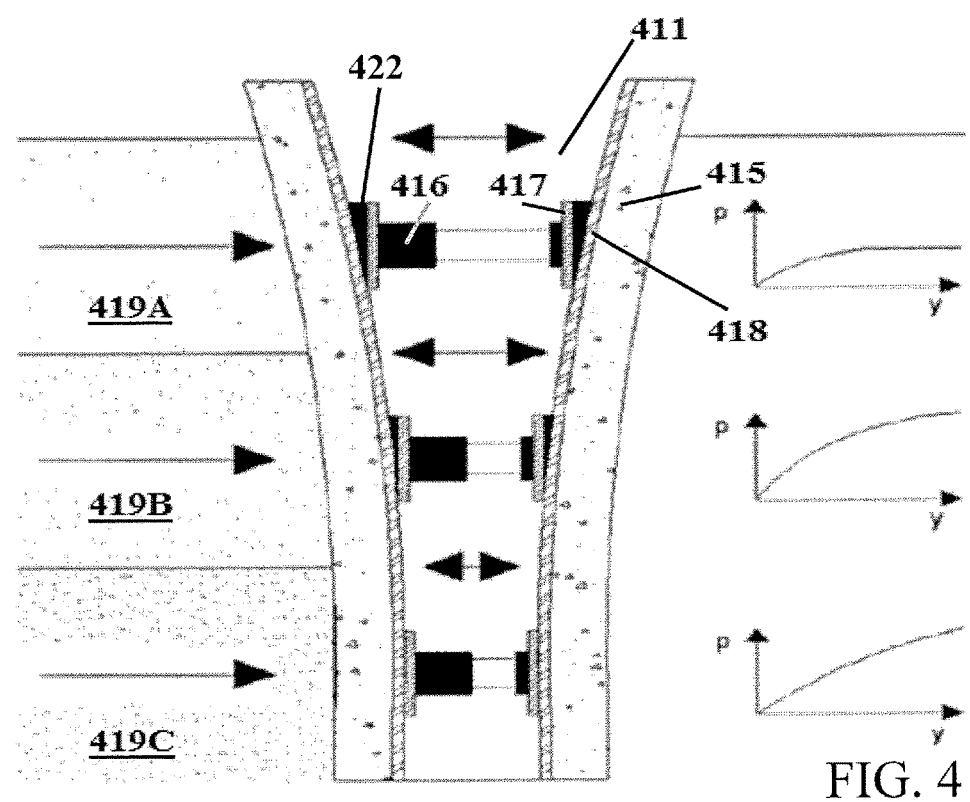
FIG. 4 shows a schematic of an implementation of a multiple assembly access channel in accordance with an embodiment of the subject invention.

2) Embodiments can use a cast-in-place access channel retrievable assembly.

a) Embodiments can use a multiple-separation access channel. The access channel structure, which is positioned into the excavation prior to concrete casting is designed to separate not only in the vertical plane (to facilitate testing as a specific depth), but also at preselected horizontal planes (so that a single retrievable jack assembly is used to test the shaft at various depths, sequentially). FIG. 3 shows a schematic of an implementation of a multiple-separation access channel.

b) Embodiments can use a multiple-assembly access channel. The access channel structure, which is positioned into the excavation prior to concrete casting is designed to separate in the vertical plane only (as per Kahne and Brown 2002), but is substantial in length, spanning the full depth of the shaft (or depth to which lateral capacity is desired to be measured), or to same portion of the same. The teaching of access channels, and positioning access channels in the excavation prior to concrete casting, such that such access channels separate in the vertical plane, in the Kahne and Brown 2002 reference, are hereby incorporated by reference in the subject application. Multiple jack assemblies, each of which are pressurized and expanded independently, are connected in a "chain" and lowered into the access channel, then all jack assemblies can be activated simultaneously to test the entire shaft simultaneously. FIG. 4 shows a schematic of an implementation of a multiple assembly access channel in accordance with an embodiment of the invention.

Figure 5A:
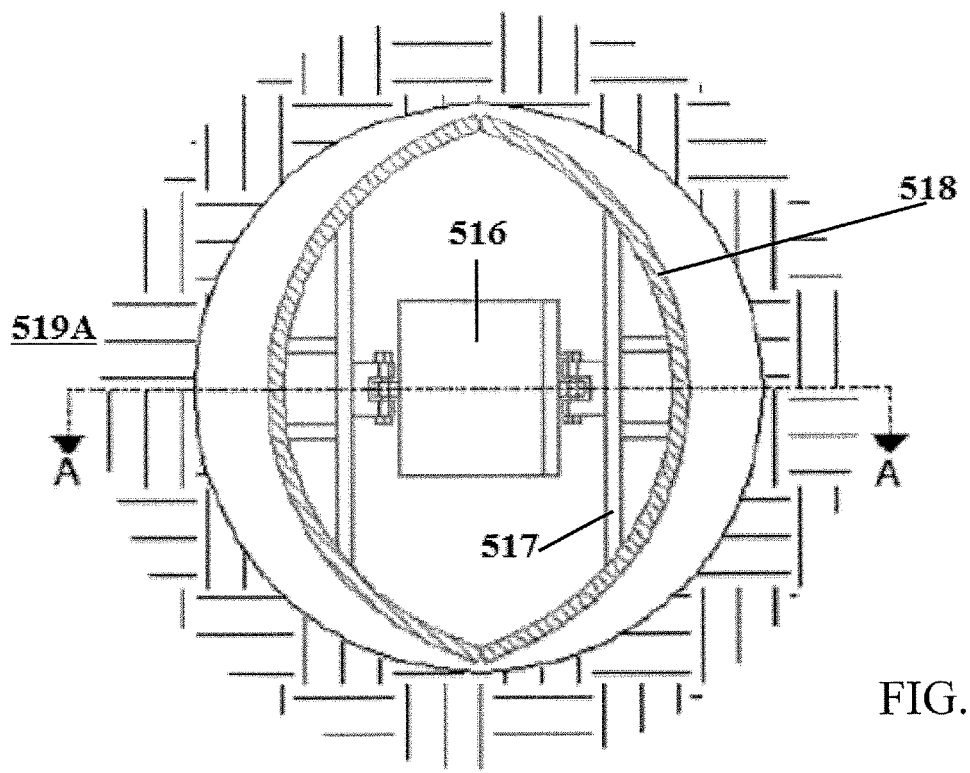
FIG. 5A shows a jack assembly plan for a single jack in a loading assembly.
Figure 5B:
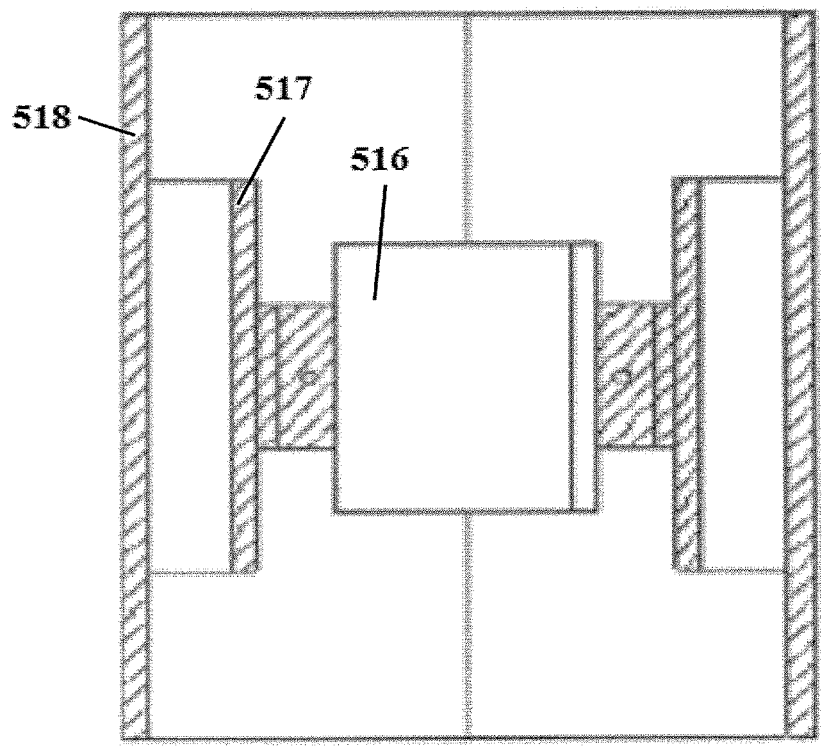
FIG. 5B is a cross-section view taken through lines A-A in FIG. 5A, showing an elevation section of the single jack in the loading assembly of FIG. 5A.
Figure 6A:
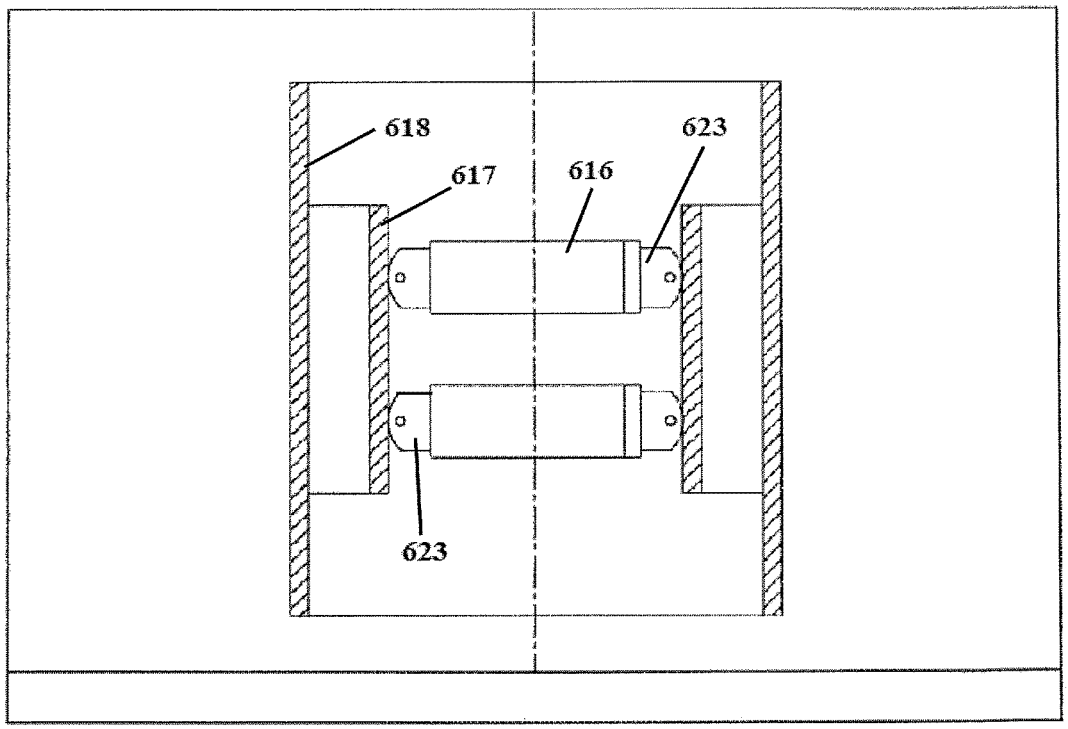
FIG. 6A shows a jack assembly having two jacks mounted in the jack assembly and that can monitor a degree of tilt during the test in accordance with an embodiment of the subject invention and FIG. 6B shows a jack assembly that uses a pivoting jack interconnected to two bearing plates in a pivotable manner, to simultaneously test shear and bearing in accordance with an embodiment of the subject invention.
Figure 6B:
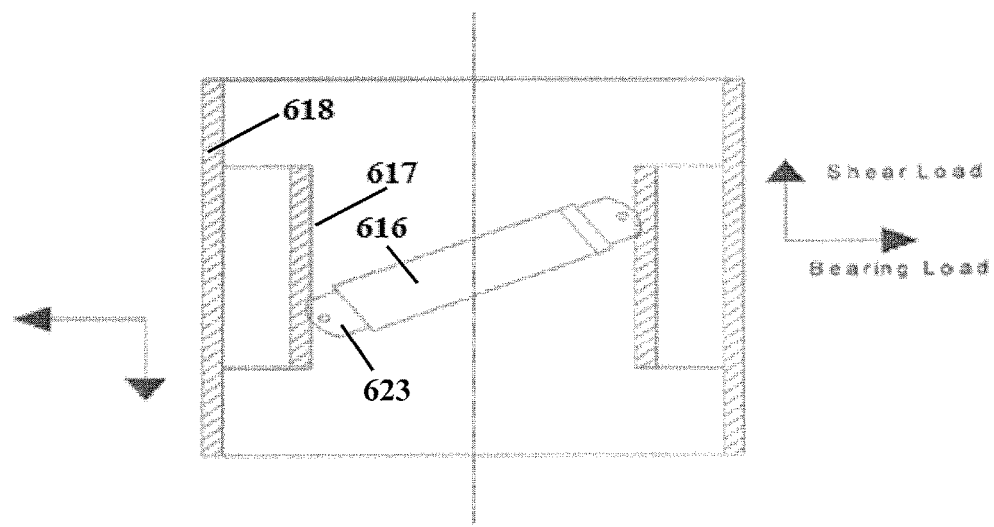

3) Embodiments can use an open excavation retrievable assembly.

a) Embodiments can use a single-jack interchangeable plate assembly. A single jack can be placed in the center of the loading assembly. Mounting points between the jack and the bearing plates allow for pivoting, so that bending moment is not induced into the jacks. Interchangeable bearing plates of different dimensions can allow testing of various standard shaft diameters. Bearing plates can fill nearly the full arc of each semi-circular half of the excavation (e.g., at least 120°, 130°, 140°, 150°, 160°, and/or 170°) with only a small gap at the splitting plane to allow the assembly to close and be freely inserted into, and retrieved out of, the excavation. The height:diameter ratio for this assembly can be about 1:1, such as 0.8:1 to 1.1; 0.9:1 to 1:1; 1.1 to 1.1:1; and/or 1:1 to 1.2:1, (e.g., FIG. 4). The height:diameter ratio for specific embodiments of this assembly can range from 0.8:1.2 to 1:1; 0.9:1.1 to 1:1; and/or be approximately 1:1 (FIGS. 5A and 5B). FIG. 5A shows a jack assembly plan for a single jack in a loading assembly. FIG. 5B shows an elevation section of the single jack in the loading assembly of FIG. 5A, through the section A-A of FIG. 5A. Other height:diameter ratios can also be implemented such as from 0.5:1 to 1:1; 2:1 to 3:1; 3:1 to 4:1; 4:1 to 5:1, or larger than 5:1. Although the arc of the bearing plates shown in FIGS. 5A and 5B are not the same as the arc of the side of the excavation, the arc of the bearing plate of the embodiment shown in FIGS. 5A and 5B can be the same as the arc of the side of the excavation, where the arc of the side of the excavation is the arc of the side of the excavation at the nominal diameter of the excavation as the excavation was excavated before the soil from the side swelled out into the volume of the excavation.

b) Embodiments can use a multi jack interchangeable plate assembly. Two or more jacks can be aligned one above the other in the loading assembly, which are pressurized independently, allow the bearing plates to be maintained in a vertical orientation. FIG. 6A shows an embodiment with two jacks pivotably mounted to two bearing plates where each jack is mounted to both bearing plates with one jack above the other. Mounting points between the jacks and the bearing plates allow for pivoting, so that a bending moment is not induced into the jacks and torques are not put of the mount between the jack and the bearing plates. Another specific embodiment can used three jacks pivotably mounted to two bearing plates where each jack is mounted to both bearing plates with one jack above the other. The loads to the two or three jacks can be controlled so the bearing plates are maintained in a vertical orientation or other desired angular orientation with respect to vertical. Interchangeable bearing plates of different dimensions allow testing of various standard shaft diameters, where each bearing plate has a size and shape corresponding to the size and shape of the excavation in which the bearing plate is to be used. Bearing plates can fill nearly the full arc of each semi-circular half of the excavation (e.g., at least 120°, 130°, 140°, 150°, 160°, and/or 170°), with only a small gap at the splitting plane to allow the assembly to close and be freely inserted into and retrieved out of the excavation. The height:diameter ratio for this assembly can be approximately 2:1, such as 2:1 to 1.8:1; 1.9:1 to 2:1; 2:1 to 2.1:1; and/or 2:1 to 2.2:1 (e.g., see FIG. 3). The height:diameter ratio for specific embodiments of this assembly can range from 0.8:1.2 to 1:1; 0.9:1.1 to 1:1; and/or be approximately 1:1. Other height:diameter ratios can also be implemented such as from 0.5:1 to 1:1; 2:1 to 3:1; 3:1 to 4:1; 4:1 to 5:1, or larger than 5:1.

c) Embodiments can use a pivoting jack(s) to simultaneously test shear and bearing. Since a pile in lateral loading will also mobilize axial shear along the pile's length, the assembly, by offsetting the two bearing plates vertically, can induce a component of shear into the mobilized reaction. A tilt-meter instrument added to the jack assembly can monitor a degree of tilting during the test, and strain gauges mounted on the bearing plates can monitor shear loading (FIG. 6B). FIG. 6B shows a jack assembly that can monitor degree of tilt during the test, where the tilting of the jack causes a vertical load to be applied to the bearing plates. The embodiment in FIG. 6B shows the jack pivotably mounted to the bearing plates at a location offset from the center of the bearing plates in the vertical direction and the bearing plates positioned at the same vertical position. In an alternative embodiment, the jack can be pivotably mounted to the bearing plates at a location at the center of the bearing plates in the vertical direction and the bearing plates positioned at positions offset in the vertical direction where the jack is tilted, to simultaneously test shear and bearing, where the jack assembly can monitor a degree of tilt of the jack, a displacement of the jack, and the load during the test, and strain gauges mounted on the bearing plates can monitor shear loading. The tilt and jack displacement can be used to determine the axial movement, if any, of the bearing plates with respect to the sides of the excavation.

d) Embodiments can use a scissor closing mechanism to assist retrieval. The loading jacks can be double-acting, with an optional separate hydraulic circuit to force the assembly closed at the end of testing for retrieval. As a secondary system to ensure retrieval, the lifting points for each assembly can consist of an articulated "scissor" action mechanism that ensures mechanical closure of the assembly when vertical tension is applied, in the event of loss of hydraulic pressure.

Figures 7A, 7B, 7C:
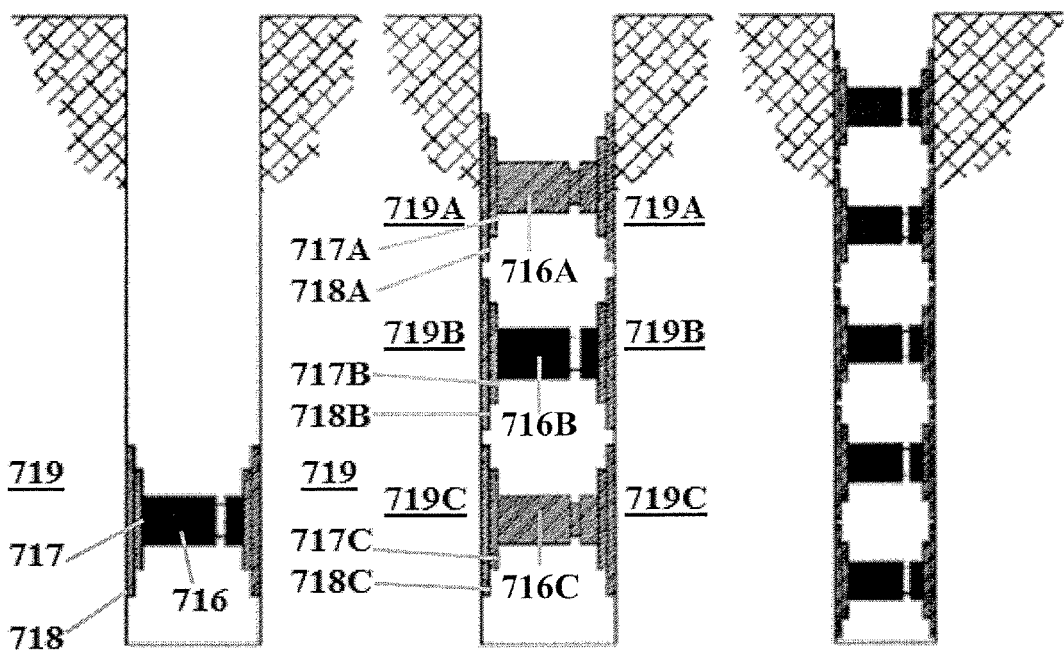
FIG. 7A shows a single jack realistic stress load (RSL) assembly.
FIG. 7B shows a 3-stack jack RSL assembly.
FIG. 7C shows a multi-stack jack RSL assembly with more than 3 jacks, in accordance with an embodiment of the subject invention.

4) Embodiments can use a modular design to enable "chaining" of assemblies. Connection points on the test assemblies can allow multiple assemblies described in Embodiments 2 and 3 to be connected together into a "stack" for simultaneous placement in the excavation. Each assembly is able to pressurize and expand independently. The hydraulic system can be independent for each assembly or the assemblies can all be connected into a single circuit. Expansion of each assembly in the chain is monitored independently. Examples of this Embodiment include:

i) A 3-stack assembly with a middle assembly providing test data, and the top assembly and the bottom assembly creating a realistic stress field in the soil (FIG. 7B). FIG. 7A shows a single jack realistic stress load (RSL) assembly, and FIG. 7B shows a 3-stack jack RSL assembly. FIG. 7C shows a multi-stack jack RSL assembly.

ii) Multi-stack to test entire excavation simultaneously.

Figure 8:
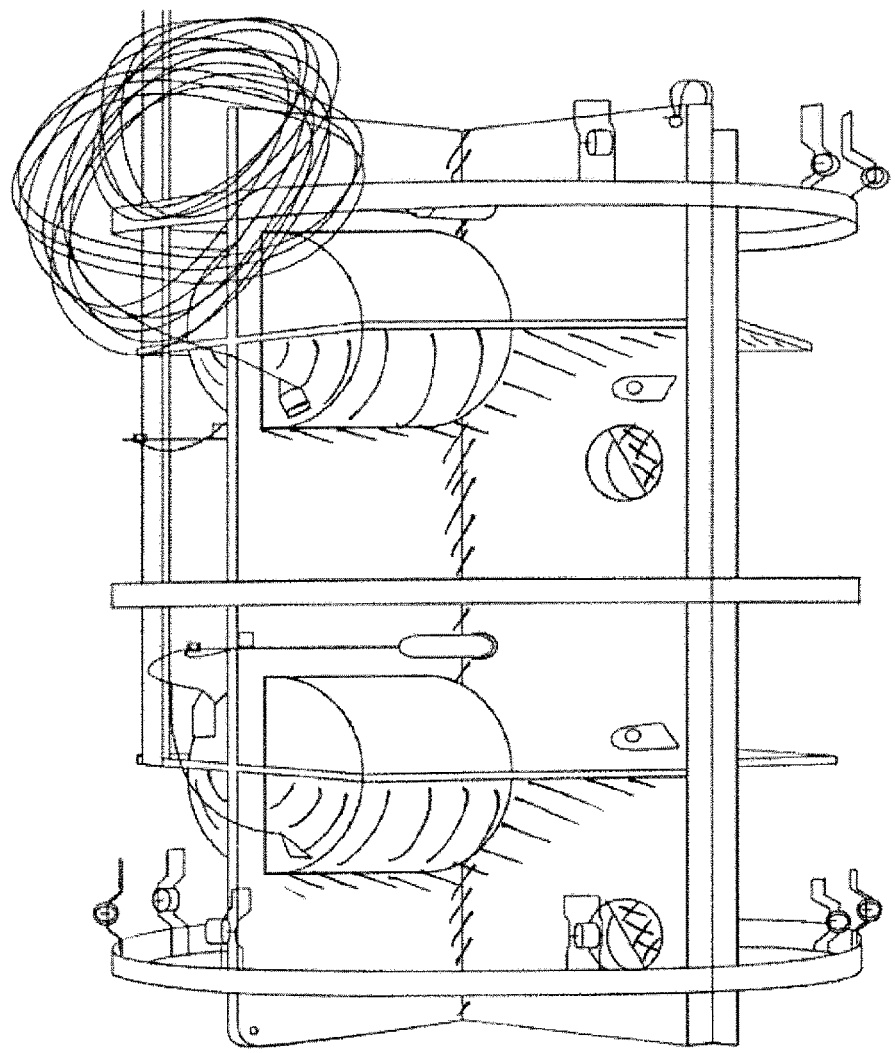
FIG. 8 shows an image of an embodiment of a split-lateral load assembly that can be used in accordance with an embodiment of the subject invention.

FIG. 8 shows an image of an embodiment of a split-lateral load assembly in accordance with the subject invention. A hydraulic jack (O-Cell™) assembly is cast within a section of the test pile, with the axis of the jack(s) (O-Cell™) jack assembly perpendicular to the axis of the pile (see FIG. 8).

When the hydraulic jack assembly is pressurized, each semi-cylinder of the section of the test pile is loaded laterally from within, against the surrounding soil or rock formation. Where multiple hydraulic jacks are used along the axis of the pile, the test can be conducted by adjusting the load of each cell independently so that the assembly expands in parallel. The results of the split-lateral load test can be presented, e.g., to the client, in the form of a load-displacement curve. In an embodiment, only the expansion of the hydraulic jack(s) is monitored, with no external reference taken into account, such that, it is assumed that the displacement of each semi-cylinder is half of the measured expansion of the hydraulic jack. Dividing the applied load by the cylinder length yields a line load vs. displacement (split-lateral or "s-1") curve. The soil-structure interaction is typically expressed in the form of a "p-y" curve, which also plots the lateral soil stiffness in terms of applied line load vs. displacement. However, the two curves may not be identical because of the differing load-transfer mechanisms between the split-lateral setup and a pile laterally loaded at the head.

Figure 9:
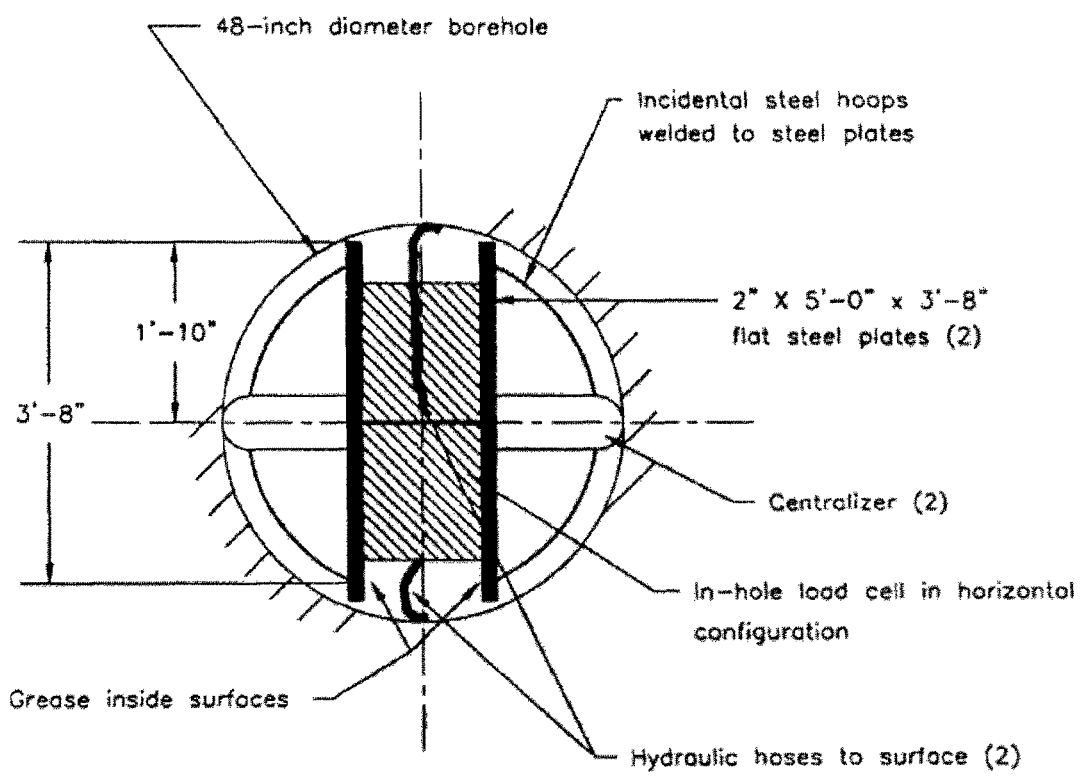
FIG. 9 shows a schematic of an apparatus that can be incorporated with embodiments of the subject invention.
Figure 14:
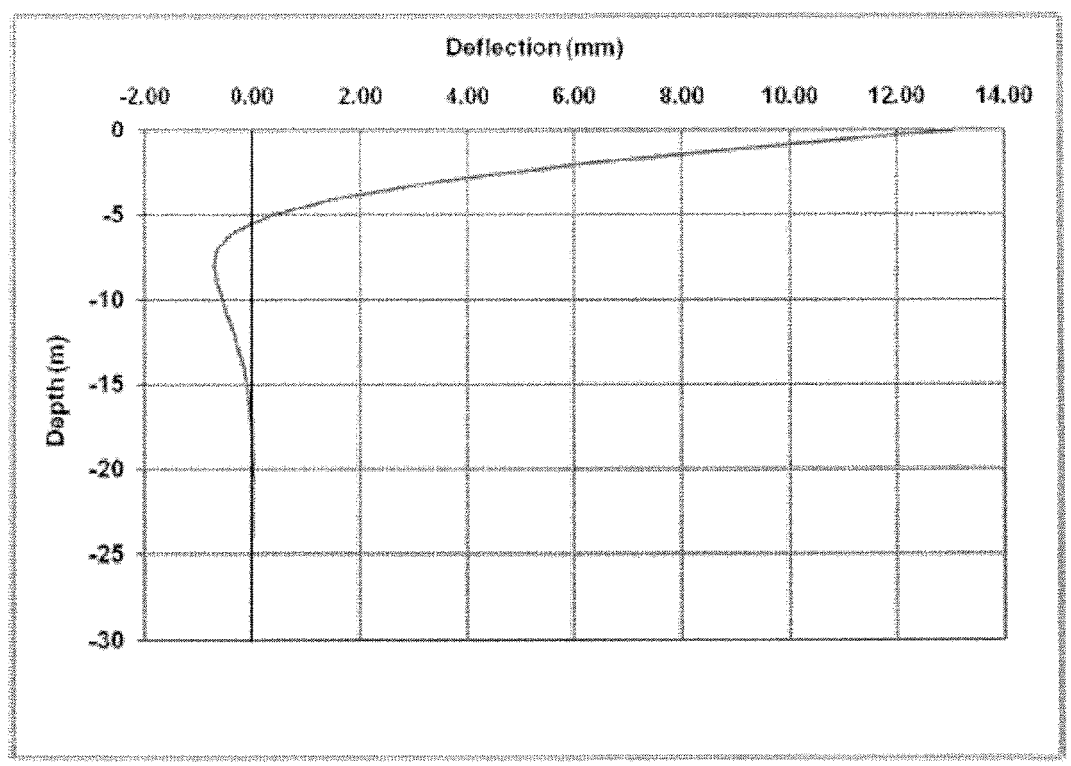
FIG. 14 shows a plot of the result of the Excel-based back-analyzed lateral pile displacement (assuming some typical pile properties) generated in a specific embodiment of the subject invention.

FIG. 9 shows a schematic of an apparatus that can be incorporated with embodiments of the subject invention (see FIG. 14 of O'Neill and Majano [ref. 1]). The teachings of the apparatus of FIG. 9 in the O'Neill and Majano reference [ref. 1] are hereby incorporated by reference in the subject application.

Figure 10A:
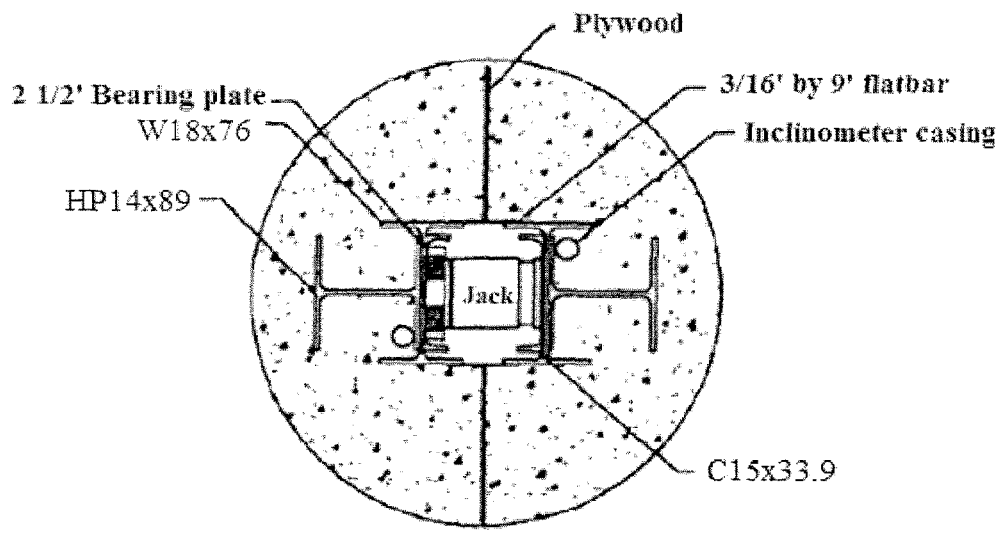
FIGS. 10A and 10B show schematics of a prior art, as disclosed by Kahne and Brown [Ref. 4]. The apparatus utilizes a jack that is retrievable after the lateral load test, which can be incorporated with embodiments of the subject invention.
Figure 10B:
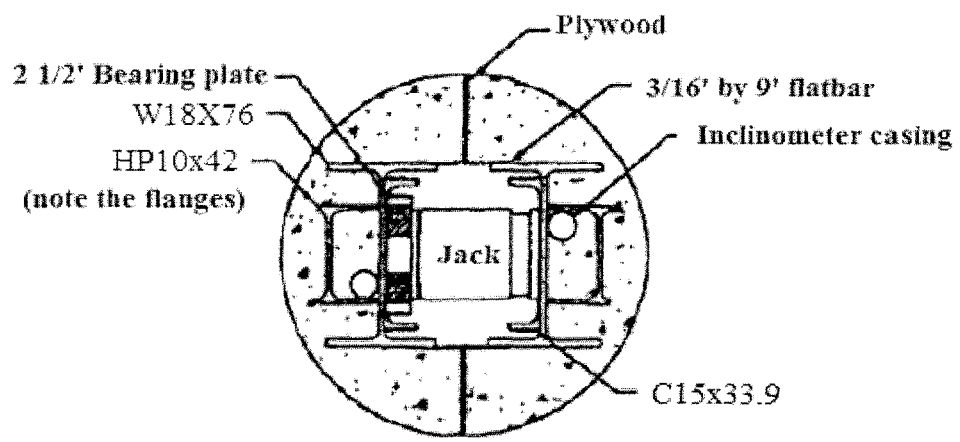
Figure 11:
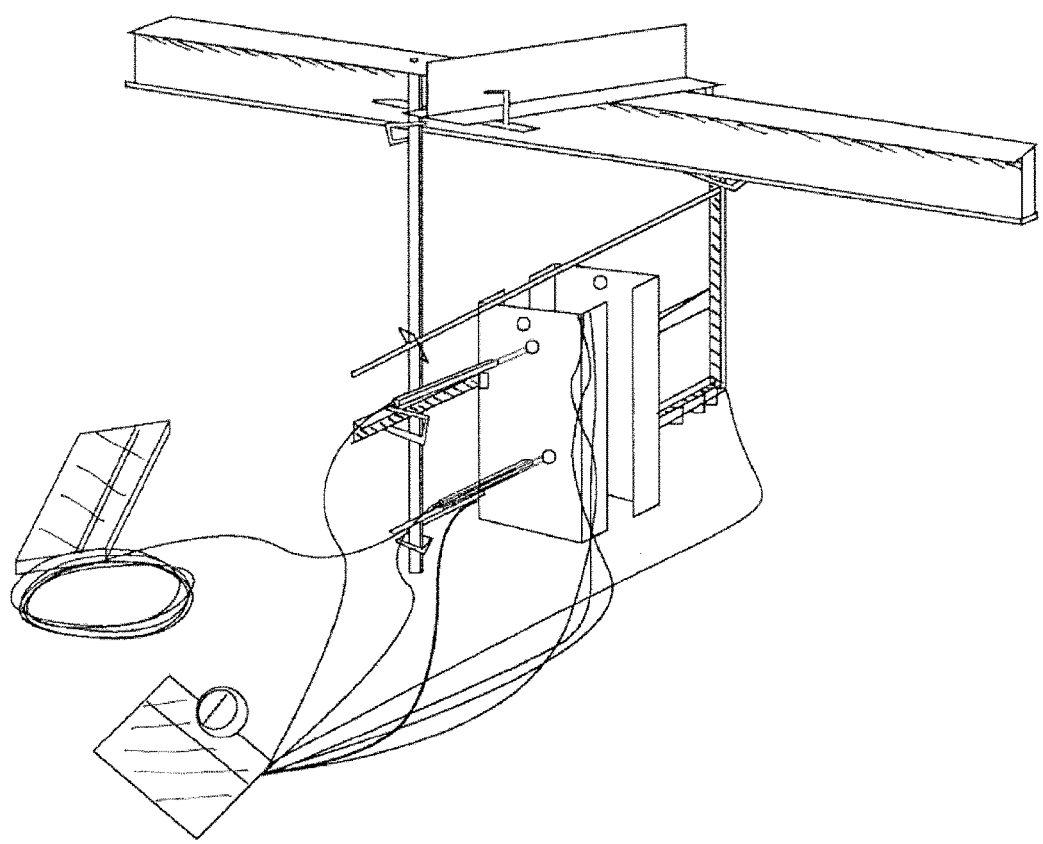
FIG. 11 shows an image of a jack guideway extending from a ground surface, which can be utilized in accordance with embodiments of the invention.

FIGS. 10A and 10B show a schematic of an apparatus utilizing a jack that is retrievable after the test, which can be incorporated with embodiments of the subject invention (see Kahne and Brown [ref. 4]). The teachings of the apparatus in FIGS. 10A and 10B in the Kahne and Brown reference [ref. 4] are hereby incorporated by reference in the subject application. FIG. 11 shows an image of a jack guideway extending from a ground surface, which can be utilized in accordance with embodiments of the invention.

EXAMPLE

Soil stiffness data at three depths can be obtained by three identical test shafts in close proximity. In a specific embodiment, soil stiffness data can be obtained via a split-lateral test apparatus positioned at a depth of 10 meters in a first of the three excavations; via a split-lateral test apparatus positioned at a depth of 16 meters in a second of the three excavations; and via a split-lateral test apparatus positioned at a depth of 23 meters in the third of the three excavations. An automated hydraulic control system was used to independently pressurize two hydraulic systems, each of the two hydraulic systems applying pressure to one of the two jacks in a load frame of the test apparatus, to minimize the difference in expansion of two hydraulic jacks positioned in the load frame, for each of the split-lateral test apparatus in the three excavations. The information from multiple tests can be used to approximate the behavior of a laterally-loaded pile, such that the information from the three tests were used to approximate the behavior of a laterally-loaded pile, and the results accurately approximated the behavior of a laterally-loaded pile.

Embodiments can derive p-y curves from the test data obtained from the split-lateral test apparatus. These derived p-y curves, when input into software, can produce results comparable to traditional lateral load tests.

Retrievable load assemblies can successfully be deployed under certain circumstances.

Load assemblies can be independently pressurized to maintain a parallel load plate expansion using an automated hydraulic control system. Specific embodiments can independently pressurize a top jack and a bottom jack interconnected to a load plate, so as to control the angle of the load plate (e.g., in a vertical orientation, or other desired angle), and/or multiple loading plates can be maintained at the same angle (e.g., vertical, or other desired angle), and/or multiple loading plates can be maintained at desired angular relationships with respect to each other.

Derivation of p-y Curves from Test Results

Figure 12:
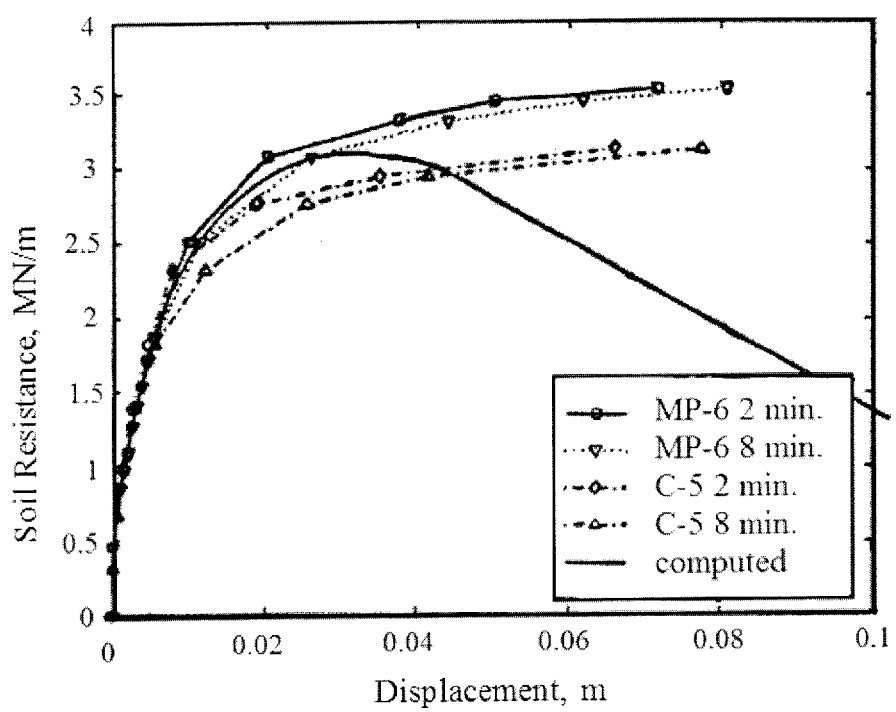
FIG. 12 shows measured vs. computed p-y curves.

Embodiments can design a foundation utilizing p-y curves as an input into a computer-based structural model. Embodiments of the split-lateral testing method in accordance with the invention can produce s-1 curves that can be converted to p-y curves in an accurate manner. An embodiment of a split-lateral test can measure these s-1 curves in a direct fashion, as opposed to being derived from an inclinometer and strain gage data in a traditional lateral load test. In specific embodiments, the s-1 curve can be multiplied by a factor, such as 1.15 or 1.5. Such multiplication by a factor can create a more accurate approximation of the p-y curve than the s-1 curve not multiplied by such a factor. The best factor to multiply the s-1 curve by can be validated by computer models or field tests. FIG. 12 shows measured vs. computer p-y curves [ref. 2].

In an embodiment, the s-1 curve and p-y curve can be assumed to be equal in all instances, although this may underpredict moments and shears within the pile.

Back-analysis of Test Results

In an embodiment, p-y curves, along with the pile properties and applied head loads, can be used as inputs to model the displacement behavior of the pile head under lateral loading using a finite-difference solution. The standard industry reference is the COM624 program and documentation, produced by Wang and Reese [ref. 3]. Split-lateral test results from embodiments of the invention can be used to produce a lateral pile load-deflection curve (or family of curves), along with associated shear vs. depth and moment vs. depth curves. In a standard lateral load test, this information must be derived from inclinometer and strain gage data. Using s-1 data and nominal pile properties in accordance with a specific embodiment, these curves can be produced either using commercial software (COM624, LPILE, FB-MultiPier) or other software.

Figure 13:
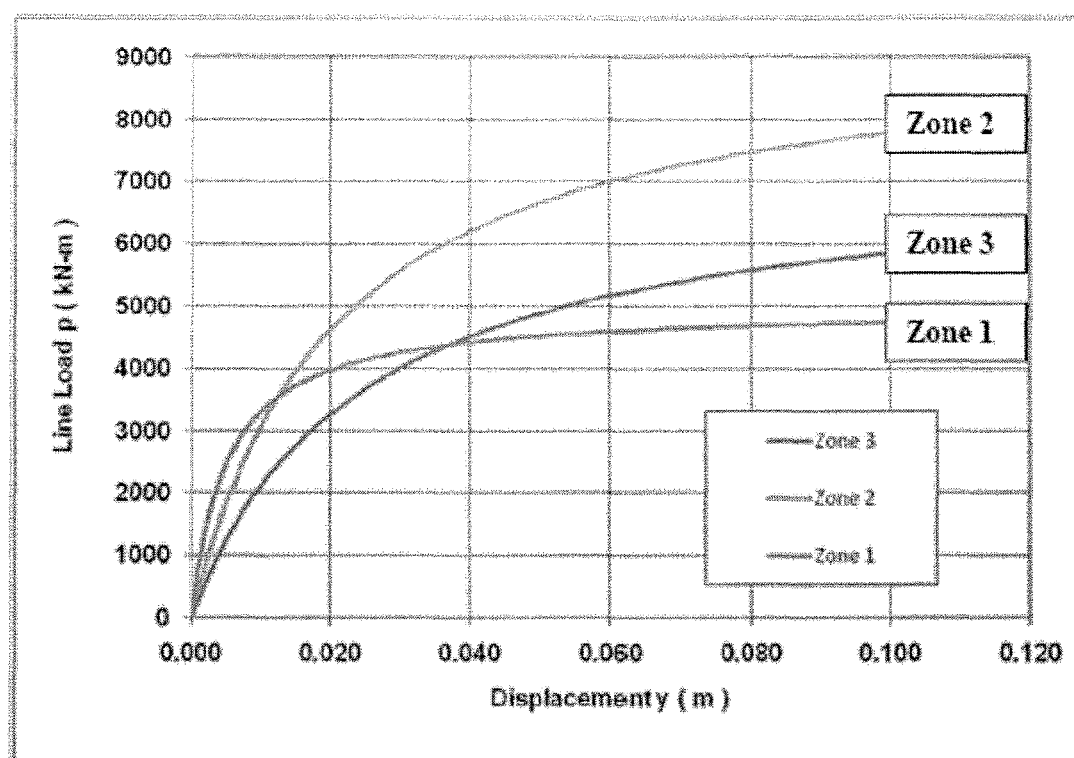
FIG. 13 shows a plot of the three line load-displacement curves (measured s-1 curves) generated in a specific embodiment of the subject invention.

As an example, FIG. 13 shows a plot of the three line load-displacement curves (measured s-1 curves) generated via the three excavations, each with a split-lateral test assembly at a different height as discussed above, which method can be incorporated with an embodiment of the subject invention. Zones 1 to 3 correspond to load assembly depths of 23, 16, and 10 meters, respectively. FIG. 14 shows a plot of the result of an Excel-based back-analyzed lateral pile displacement (assuming some typical pile properties), which method can be incorporated with an embodiment of the subject invention.

EMBODIMENTS

Embodiment 1. An apparatus for performing a split-lateral test, comprising:
  a loading mechanism,
  wherein the loading mechanism comprises:
  a first bearing plate;
  a second bearing plate;
  a hydraulic jack,
  wherein the hydraulic jack comprises:
    a piston, a chamber, and a hydraulic fluid input, such that when pressurized hydraulic fluid is inputted to the hydraulic fluid input, the pressurized hydraulic fluid pushes the piston and pushes the chamber such that the piston tends to extend from the chamber, wherein the loading mechanism is configured such that when pressurized hydraulic fluid is inputted to the hydraulic fluid input the piston applies a first force to the first bearing plate and the chamber applies a second force to the second bearing plate tending to push the first bearing plate and the second bearing plate away from each other, wherein the first force has a first force magnitude and is in a first force direction, wherein the second force has a second force magnitude and is in a second force direction, wherein the second force direction is opposite the first force direction, wherein the loading mechanism is configured to be positioned in a load orientation within an excavation having:
  an excavation diameter, d, greater than or equal to 24 inches;
  an excavation depth, D, greater than or equal to 5 feet; and
  an excavation longitudinal axis parallel with gravitational field lines of the surrounding gravitational field,
such that a piston longitudinal axis is perpendicular to the excavation longitudinal axis, wherein when the loading mechanism is positioned in the load orientation within the excavation and pressurized hydraulic fluid having a pressure, P, greater than a first threshold is inputted to the hydraulic fluid input, the piston extends from the chamber until the first bearing plate contacts a first section of a side of the excavation and the second bearing plate contacts a second section of the side of the excavation, wherein when the loading mechanism is positioned in the load orientation within the excavation, the first bearing plate is in contact with the first section of the side of the excavation, the second bearing plate is in contact with the second section of the side of the excavation, and pressurized hydraulic fluid with pressure, P, greater than a second threshold is inputted to the hydraulic fluid input,
  (i) the first bearing plate applies a first lateral load to the first section of the side of the excavation;
  (ii) the second bearing plate applies a second lateral load to the second section of the side of the excavation, and
  (iii) the piston extends from the chamber by displacement, 2y, wherein the first lateral load has a first load magnitude and is in a first load direction, wherein the second lateral load has a second load magnitude and is in a second load direction, wherein the second load magnitude is the same as the first load magnitude, wherein the second load direction is opposite the first load direction.

Embodiment 2. The apparatus according to Embodiment 1,
wherein the first bearing plate has a first contact surface, wherein when the first bearing plate applies the first lateral load to the first section of the side of the excavation, the first contact surface contacts a corresponding first section of a surface of the side of the excavation and the first contact surface pushes the first section of the surface of the side of the excavation, wherein the first contact surface has a first contact surface shape that corresponds to a first section shape of the first section of the side of the excavation, wherein the second bearing plate has a second contact surface, wherein when the second bearing plate applies the second lateral load to the second section of the side of the excavation, the second contact surface contacts a corresponding second section of the surface of the side of the excavation and the second contact surface pushes the second section of the surface of the side of the excavation, wherein the second contact surface has a second contact surface shape that corresponds to a second section shape of the second section of the side of the excavation.

Embodiment 3. The apparatus according to Embodiment 1, further comprising:
  a processor,
  wherein the processor is configured to receive hydraulic pressure readings and displacement readings and determine a lateral soil stiffness of the first section of the side of the excavation and the second section of the side of the excavation.

Embodiment 4. The apparatus according to Embodiment 1,
wherein the excavation is for a deep foundation element.

Embodiment 5. The apparatus according to Embodiment 4,
wherein the deep foundation element is a cast-in-place pile,
wherein the loading mechanism is at least partially encased with a section of the cast-in-place pile.

Embodiment 6. The apparatus according to Embodiment 1,
wherein application of the first lateral load and the second lateral load does not require an external reaction system.

Embodiment 7. The apparatus according to Embodiment 4,
wherein excavation has a diameter in the range of 24 inches to 120 inches.

Embodiment 8. The apparatus according to Embodiment 4,
wherein the deep foundation element is an offshore deep foundation element.

Embodiment 9. The apparatus according to Embodiment 1,
wherein the loading mechanism is configured to be retrievable from the excavation after application of the first lateral load and the second lateral load.

Embodiment 10. The apparatus according to Embodiment 1, further comprising:
  at least one additional loading mechanism.

Embodiment 11. The apparatus according to Embodiment 1, further comprising:
  at least two additional loading mechanisms,
  wherein the loading mechanism and the at least two additional loading mechanisms chained together, each of the loading mechanism and the at least two additional loading mechanisms apply corresponding first lateral loads and second lateral loads to create a stress field similar to stress field created by a pile in lateral loading via application of a lateral load to a head of the pile in the excavation.

Embodiment 12. The apparatus according to Embodiment 1,
wherein the hydraulic jack is a double action hydraulic jack.

Embodiment 13. The apparatus according to Embodiment 12,
wherein the double action hydraulic jack permits active cycling of the first lateral load and the second lateral load.

Embodiment 14. The apparatus according to Embodiment 13,
wherein the active cycling of the first lateral load and the second lateral load simulates lateral loads experienced by structures due to one of the following:
  ocean waves, earthquakes, gusting winds, and vortex shedding in steady water currents.

Embodiment 15. The apparatus according to Embodiment 1, wherein mounting points between the hydraulic jack and the first bearing plate and the second bearing plate can allow for pivoting, such that a bending moment is not induced into the hydraulic jack.

Embodiment 16. The apparatus according to Embodiment 1, wherein an expansion of the hydraulic jack is monitored, wherein a pressure of the pressurized hydraulic fluid inputted into the pressurized hydraulic fluid input in monitored.

Embodiment 17. The apparatus according to Embodiment 1, further comprising:

at least one additional hydraulic jack, wherein the hydraulic jack and the at least one additional hydraulic jack are each connected to the first bearing plate and the second bearing plate and are aligned one above the other, wherein the hydraulic jack and the at least one additional hydraulic jack are pressurized independently such that the first bearing plate and the second bearing plate are maintained in a vertical orientation during application of the first lateral load and the second lateral load.

Embodiment 18. The apparatus according to Embodiment 1, further comprising:

a multiple-separation access channel, wherein the multiple-separation access channel is positioned into the excavation is configured to separate in a vertical plane and at preselected horizontal planes, wherein the first lateral load and the second lateral load are applied by pushing on the multiple-separation access channel.

Embodiment 19. The apparatus according to Embodiment 1, further comprising:

a multiple-assembly access channel, wherein the multiple-assembly access channel is positioned into the excavation is configured to separate in the vertical plane only and spans the depth of the excavation to which lateral capacity is to be measured;

at least two additional loading mechanisms, wherein the loading mechanism and the at least two additional loading mechanisms chained together, each of the loading mechanism and the at least two additional loading mechanisms apply corresponding first lateral loads and second lateral loads to the multiple-assembly access channel to create a stress field similar to stress field created by a pile in lateral loading via application of a lateral load to a head of the pile in the excavation.

Embodiment 20. The apparatus according to Embodiment 19, wherein the loading mechanism and the at least two additional loading mechanisms are pressurized and expanded independently and simultaneously.

Embodiment 21. The apparatus according to Embodiment 1, wherein a height:diameter ratio for the loading mechanism is 0.8:1 to 1.1.2.

Embodiment 22. The apparatus according to Embodiment 17, wherein a height:diameter ratio for the loading mechanism is 1.8:1 to 1:2.2.

Embodiment 23. The apparatus according to Embodiment 15, further comprising:

a tilt-meter instrument, wherein the tilt-meter instrument monitors a degree of tilting of the hydraulic jack during application of the first lateral load and the second lateral load, wherein the first bearing plate and the second bearing plate are offset vertically, wherein the apparatus simultaneously tests shear and bearing, wherein a component of shear is introduced.

Embodiment 24. The apparatus according to Embodiment 17, further comprising:

a tilt-meter instrument, wherein the tilt-meter instrument monitors a degree of tilting of the hydraulic jack during application of the first lateral load and the second lateral load, wherein mounting points between the hydraulic jack and the first bearing plate and the second bearing plate allow for pivoting, such that a bending moment is not induced into the hydraulic jack, wherein mounting points between the at least one additional hydraulic jack and the first bearing plate and the second bearing plate allow for pivoting, such that a bending moment is not induced into the at least one additional hydraulic jack wherein the first bearing plate and the second bearing plate are offset vertically, wherein the apparatus simultaneously tests shear and bearing, wherein a component of shear is introduced.

Embodiment 25. The apparatus according to Embodiment 23, further comprising:

strain gauges mounted on the first bearing plate and the second bearing plate, wherein the strain gauges monitor shear loading during application of the first lateral load and the second lateral load.

Embodiment 26. The apparatus according to Embodiment 1, wherein a lifting point for the loading mechanism comprises an articulated scissor action closing mechanism, wherein the articulated scissor action closing mechanism closes when vertical tension is applied to the lifting point.

Embodiment 27. The apparatus according to Embodiment 26, wherein the hydraulic jack is double-acting, Embodiment 28. The apparatus according to Embodiment 27, further comprising:

a hydraulic circuit, wherein inputting pressurized hydraulic fluid into the hydraulic circuit forces the loading mechanism to close for retrieval.

Embodiment 29. The apparatus according to Embodiment 1, further comprising:

a processor, wherein the processor produces an s-1 curve.

Embodiment 30. The apparatus according to Embodiment 29, wherein the processor the multiplies the s-1 curve by a factor.

Embodiment 31. A method for performing a split-lateral test positioning a loading mechanism, wherein the loading mechanism comprises:

a first bearing plate;

a second bearing plate;

a hydraulic jack, wherein the hydraulic jack comprises:

a piston, a chamber, and a hydraulic fluid input, such that when pressurized hydraulic fluid is inputted to the hydraulic fluid input, the pressurized hydraulic fluid pushes the piston and pushes the chamber such that the piston tends to extend from the chamber, wherein the loading mechanism is configured such that when pressurized hydraulic fluid is inputted to the hydraulic fluid input the piston applies a first force to the first bearing plate and the chamber applies a second force to the second bearing plate tending to push the first bearing plate and the second bearing plate away from each other, wherein the first force has a first force magnitude and is in a first force direction, wherein the second force has a second force magnitude and is in a second force direction, wherein the second force direction is opposite the first force direction, wherein the loading mechanism is configured to be positioned in a load orientation within an excavation having:
an excavation diameter, d, greater than or equal to 24 inches;
an excavation depth, D, greater than or equal to 5 feet; and
an excavation longitudinal axis parallel with gravitational field lines of the surrounding gravitational field,
such that a piston longitudinal axis is perpendicular to the excavation longitudinal axis, wherein when the loading mechanism is positioned in the load orientation within the excavation and pressurized hydraulic fluid having a pressure, P, greater than a first threshold is inputted to the hydraulic fluid input, the piston extends from the chamber until the first bearing plate contacts a first section of a side of the excavation and the second bearing plate contacts a second section of the side of the excavation, wherein when the loading mechanism is positioned in the load orientation within the excavation, the first bearing plate is in contact with the first section of the side of the excavation, the second bearing plate is in contact with the second section of the side of the excavation, and pressurized hydraulic fluid with pressure, P, greater than a second threshold is inputted to the hydraulic fluid input,
(i) the first bearing plate applies a first lateral load to the first section of the side of the excavation;
(ii) the second bearing plate applies a second lateral load to the second section of the side of the excavation, and
(iii) the piston extends from the chamber by displacement, 2y, wherein the first lateral load has a first load magnitude and is in a first load direction, wherein the second lateral load has a second load magnitude and is in a second load direction, wherein the second load magnitude is the same as the first load magnitude, wherein the second load direction is opposite the first load direction, wherein the loading mechanism is positioned within the excavation in the loading orientation, inputting pressurized hydraulic fluid to the hydraulic fluid input such that the first lateral load and the second lateral load are applied.

Embodiment 32. The method according to Embodiment 31, further comprising:
determining a lateral soil stiffness of the first section of the side of the excavation and the second section of the side of the excavation.

Embodiment 33. The method according to Embodiment 31, further comprising:
repositioning the loading mechanism within the excavation;
inputting pressurized hydraulic fluid to the hydraulic fluid input such that the first lateral load and the second lateral load are applied to a further first section of the side of the excavation and a further second section of the side of the excavation;
determining a lateral soil stiffness of the further first section of the side of the excavation and the further second section of the side of the excavation.

Embodiment 34. The method according to Embodiment 31,
wherein the excavation is for a deep foundation element.

Embodiment 35. The method according to Embodiment 31,
wherein the deep foundation element is a cast-in-place pile.

Embodiment 36. The method according to Embodiment 32,
determining soil modulus ($E_s$) information from the lateral soil stiffness in a form analogous to a p-y curve.

Embodiment 37. The method according to Embodiment 31, further comprising:
retrieving the loading mechanism from the excavation after applying the first lateral load and the second lateral load.

Embodiment 38. The method according to Embodiment 31,
wherein applying the first lateral load and the second lateral load comprise:
re-compressing the first section of the side and the second section of the side that swelled after excavating the excavation back to its original position;
compressing the first section of the side and the second section of the side further, into a compressed state, and, Embodiment 39. The method according to Embodiment 38, further comprising:
compressing the first section of the side and the second section of the side further until ultimate capacity is reached.

Embodiment 40. The method according to Embodiment 32,
wherein the first bearing plate has a first contact surface, wherein when the first bearing plate applies the first lateral load to the first section of the side of the excavation, the first contact surface contacts a corresponding first section of a surface of the side of the excavation and the first contact surface pushes the first section of the surface of the side of the excavation, wherein the first contact surface has a first contact surface shape that corresponds to a first section shape of the first section of the side of the excavation, wherein the second bearing plate has a second contact surface, wherein when the second bearing plate applies the second lateral load to the second section of the side of the excavation, the second contact surface contacts a corresponding second section of the surface of the side of the excavation and the second contact surface pushes the second section of the surface of the side of the excavation, wherein the second contact surface has a second contact surface shape that corresponds to a second section shape of the second section of the side of the excavation, wherein first contact surface shape and the second contact surface shape have full semi-circular cross sectional shape, wherein a lateral shear component of load resistance is incorporated into the lateral soil stiffness of the first section of the side of the excavation and the second section of the side of the excavation.

Embodiment 41. A method of modeling pile response to lateral loading, comprising:
performing the method of Embodiment 32;
using the lateral soil stiffness of the first section of the side of the excavation and the second section of the side of the excavation to model pile response to lateral loading applied to a head of a pile cast is an excavation similar to the excavation.

Aspects of the invention may be described in the general context of computer-executable instructions, such as program modules, being executed by a computer. Generally, program modules include routines, programs, objects, components, data structures, etc., which perform particular tasks or implement particular abstract data types. Moreover, those skilled in the art will appreciate that the invention may be practiced with a variety of computer-system configurations, including multiprocessor systems, microprocessor-based or programmable-consumer electronics, minicomputers, mainframe computers, and the like. Any number of computer systems and computer networks are acceptable for use with the present invention.

Specific hardware devices, programming languages, components, processes, protocols, and numerous details including operating environments and the like are set forth to provide a thorough understanding of the present invention. In other instances, structures, devices, and processes are shown in block-diagram form, rather than in detail, to avoid obscuring the present invention. But an ordinary-skilled artisan would understand that the present invention may be practiced without these specific details. Computer systems, servers, work stations, and other machines may be connected to one another across a communication medium including, for example, a network or networks.

As one skilled in the art will appreciate, embodiments of the present invention may be embodied as, among other things, a method, system, or computer-program product. Accordingly, the embodiments may take the form of a hardware embodiment, a software embodiment, or an embodiment combining software and hardware. In an embodiment, the present invention takes the form of a computer-program product that includes computer-usable instructions embodied on one or more computer-readable media.

Computer-readable media include both volatile and non-volatile media, transient and non-transient media, removable and nonremovable media, and contemplate media readable by a database, a switch, and various other network devices. By way of example, and not limitation, computer-readable media comprise media implemented in any method or technology for storing information. Examples of stored information include computer-usable instructions, data structures, program modules, and other data representations. Media examples include, but are not limited to, information-delivery media, RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These technologies can store data momentarily, temporarily, or permanently.

The invention may be practiced in distributed-computing environments where tasks are performed by remote-processing devices that are linked through a communications network. In a distributed-computing environment, program modules may be located in both local and remote computer-storage media including memory storage devices. The computer-useable instructions form an interface to allow a computer to react according to a source of input. The instructions cooperate with other code segments to initiate a variety of tasks in response to data received in conjunction with the source of the received data.

The present invention may be practiced in a network environment such as a communications network. Such networks are widely used to connect various types of network elements, such as routers, servers, gateways, and so forth. Further, the invention may be practiced in a multi-network environment having various, connected public and/or private networks.

Communication between network elements may be wireless or wireline (wired). As will be appreciated by those skilled in the art, communication networks may take several different forms and may use several different communication protocols. And the present invention is not limited by the forms and communication protocols described herein.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

REFERENCES

1. O'Neill, M. W. and Majano, R. E.,—"Analysis of Axial and Lateral Drilled Shaft Socket Load Tests and Axial Pile Load Tests for Foundations for T-36 Bridge over the St. Croix River, Stillwater, Minn.," report to the Minnesota Department of Transportation, 1995.
2. Brown, D. A. and Camp, W.—"Lateral Load Testing Program for the Cooper River Bridge, Charleston, S. C.," *Deep Foundations* 2002 *Conference Proceedings, Geotechnical Special Publication,* 1(116):95-109, ASCE 2002.
3. Wang, S. T. and Reece, L. C.—"COM624P—Laterally Loaded Pile Analysis Program for the Microcomputer, Version 2.0 Manual," *USDOT FHWA Publication No. FHWA-SA*-91-048, 1993.
4. Kahne, K. J. and Brown, D. A.—"Performance of Laterally Loaded Drilled Sockets Founded in Weathered Quartzite," Master's Thesis (Kahne), Auburn University, 2002.
5. Reese, L. C., Cox, W. R. and Koop, F. D.—"Analysis of Laterally Loaded Piles in Sand," Proceedings, *6th Offshore Technology Conference,* 1974, 2:473-484.

The invention claimed is:
1. An apparatus for performing a split-lateral test, comprising:
a loading mechanism,
wherein the loading mechanism comprises:
a first bearing plate;
a second bearing plate;
a hydraulic jack,
wherein the hydraulic jack comprises:
a piston, a chamber, and a hydraulic fluid input, such that when pressurized hydraulic fluid is inputted to the hydraulic fluid input, the pressurized hydraulic fluid pushes the piston and pushes the chamber such that the piston tends to extend from the chamber,
wherein the loading mechanism is configured such that when pressurized hydraulic fluid is inputted to the hydraulic fluid input the piston applies a first force to the first bearing plate and the chamber applies a second force to the second bearing plate tending to push the first bearing plate and the second bearing plate away from each other, wherein the first force has a first force magnitude and is in a first force direction, wherein the second force has a second force magnitude and is in a second force direction, wherein the second force direction is opposite the first force direction,
wherein the loading mechanism is configured to be positioned in a load orientation within an excavation having:

an excavation diameter, d, greater than or equal to 24 inches;

an excavation depth, D, greater than or equal to 5 feet; and an excavation longitudinal axis parallel with gravitational field lines of the surrounding gravitational field, such that a piston longitudinal axis is perpendicular to the excavation longitudinal axis, wherein when the loading mechanism is positioned in the load orientation within the excavation and pressurized hydraulic fluid having a pressure, P, greater than a first threshold is inputted to the hydraulic fluid input, the piston extends from the chamber until the first bearing plate contacts a first section of a side of the excavation and the second bearing plate contacts a second section of the side of the excavation, wherein when the loading mechanism is positioned in the load orientation within the excavation, the first bearing plate is in contact with the first section of the side of the excavation, the second bearing plate is in contact with the second section of the side of the excavation, and pressurized hydraulic fluid with pressure, P, greater than a second threshold is inputted to the hydraulic fluid input, (i) the first bearing plate applies a first lateral load to the first section of the side of the excavation;

(ii) the second bearing plate applies a second lateral load to the second section of the side of the excavation, and (iii) the piston extends from the chamber by displacement, 2y, wherein the first lateral load has a first load magnitude and is in a first load direction, wherein the second lateral load has a second load magnitude and is in a second load direction, wherein the second load magnitude is the same as the first load magnitude, wherein the second load direction is opposite the first load direction.

2. The apparatus according to claim 1,
wherein the first bearing plate has a first contact surface, wherein when the first bearing plate applies the first lateral load to the first section of the side of the excavation, the first contact surface contacts a corresponding first section of a surface of the side of the excavation and the first contact surface pushes the first section of the surface of the side of the excavation, wherein the first contact surface has a first contact surface shape that corresponds to a first section shape of the first section of the side of the excavation, wherein the second bearing plate has a second contact surface, wherein when the second bearing plate applies the second lateral load to the second section of the side of the excavation, the second contact surface contacts a corresponding second section of the surface of the side of the excavation and the second contact surface pushes the second section of the surface of the side of the excavation, wherein the second contact surface has a second contact surface shape that corresponds to a second section shape of the second section of the side of the excavation.

3. The apparatus according to claim 1, further comprising:
a processor,
wherein the processor is configured to receive hydraulic pressure readings and displacement readings and determine a lateral soil stiffness of the first section of the side of the excavation and the second section of the side of the excavation.

4. The apparatus according to claim 1,
wherein the excavation is for a deep foundation element.

5. The apparatus according to claim 4,
wherein excavation has a diameter in the range of 24 inches to 120 inches.

6. The apparatus according to claim 1,
wherein the loading mechanism is configured to be retrievable from the excavation after application of the first lateral load and the second lateral load.

7. The apparatus according to claim 1, further comprising:
at least one additional loading mechanism.

8. The apparatus according to claim 1, further comprising:
at least two additional loading mechanisms,
wherein the loading mechanism and the at least two additional loading mechanisms chained together, each of the loading mechanism and the at least two additional loading mechanisms apply corresponding first lateral loads and second lateral loads to create a stress field similar to stress field created by a pile in lateral loading via application of a lateral load to a head of the pile in the excavation.

9. The apparatus according to claim 1,
wherein the hydraulic jack is a double action hydraulic jack.

10. The apparatus according to claim 1,
wherein mounting points between the hydraulic jack and the first bearing plate and the second bearing plate can allow for pivoting, such that a bending moment is not induced into the hydraulic jack.

11. The apparatus according to claim 1,
wherein an expansion of the hydraulic jack is monitored, wherein a pressure of the pressurized hydraulic fluid inputted into the pressurized hydraulic fluid input in monitored.

12. The apparatus according to claim 1, further comprising:
at least one additional hydraulic jack,
wherein the hydraulic jack and the at least one additional hydraulic jack are each connected to the first bearing plate and the second bearing plate and are aligned one above the other, wherein the hydraulic jack and the at least one additional hydraulic jack are pressurized independently such that the first bearing plate and the second bearing plate are maintained in a vertical orientation during application of the first lateral load and the second lateral load.

13. The apparatus according to claim 1, further comprising:
a multiple-separation access channel, wherein the multiple-separation access channel is positioned into the excavation is configured to separate in a vertical plane and at preselected horizontal planes, wherein the first lateral load and the second lateral load are applied by pushing on the multiple-separation access channel.

14. The apparatus according to claim 1, further comprising:
a multiple-assembly access channel, wherein the multiple-assembly access channel is positioned into the excavation is configured to separate in the vertical plane only and spans the depth of the excavation to which lateral capacity is to be measured;
at least two additional loading mechanisms,
wherein the loading mechanism and the at least two additional loading mechanisms chained together, each of the loading mechanism and the at least two additional loading mechanisms apply corresponding first lateral loads and second lateral loads to the multiple-assembly access channel to create a stress field similar to stress field created by a pile in lateral loading via application of a lateral load to a head of the pile in the excavation.

15. The apparatus according to claim 14,
wherein the loading mechanism and the at least two additional loading mechanisms are pressurized and expanded independently and simultaneously.

16. The apparatus according to claim 15, further comprising:
a tilt-meter instrument, wherein the tilt-meter instrument monitors a degree of tilting of the hydraulic jack during application of the first lateral load and the second lateral load,
wherein the first bearing plate and the second bearing plate are offset vertically, wherein the apparatus simultaneously tests shear and bearing, wherein a component of shear is introduced.

17. The apparatus according to claim 1,
wherein a lifting point for the loading mechanism comprises an articulated scissor action closing mechanism, wherein the articulated scissor action closing mechanism closes when vertical tension is applied to the lifting point.

18. The apparatus according to claim 17,
wherein the hydraulic jack is double-acting.

19. A method for performing a split-lateral test
positioning a loading mechanism,
wherein the loading mechanism comprises:
a first bearing plate;
a second bearing plate;
a hydraulic jack,
wherein the hydraulic jack comprises:
a piston, a chamber, and a hydraulic fluid input, such that when pressurized hydraulic fluid is inputted to the hydraulic fluid input, the pressurized hydraulic fluid pushes the piston and pushes the chamber such that the piston tends to extend from the chamber,
wherein the loading mechanism is configured such that when pressurized hydraulic fluid is inputted to the hydraulic fluid input the piston applies a first force to the first bearing plate and the chamber applies a second force to the second bearing plate tending to push the first bearing plate and the second bearing plate away from each other, wherein the first force has a first force magnitude and is in a first force direction, wherein the second force has a second force magnitude and is in a second force direction, wherein the second force direction is opposite the first force direction,
wherein the loading mechanism is configured to be positioned in a load orientation within an excavation having:
an excavation diameter, d, greater than or equal to 24 inches;
an excavation depth, D, greater than or equal to 5 feet; and
an excavation longitudinal axis parallel with gravitational field lines of the surrounding gravitational field,
such that a piston longitudinal axis is perpendicular to the excavation longitudinal axis,
wherein when the loading mechanism is positioned in the load orientation within the excavation and pressurized hydraulic fluid having a pressure, P, greater than a first threshold is inputted to the hydraulic fluid input, the piston extends from the chamber until the first bearing plate contacts a first section of a side of the excavation and the second bearing plate contacts a second section of the side of the excavation,
wherein when the loading mechanism is positioned in the load orientation within the excavation, the first bearing plate is in contact with the first section of the side of the excavation, the second bearing plate is in contact with the second section of the side of the excavation, and pressurized hydraulic fluid with pressure, P, greater than a second threshold is inputted to the hydraulic fluid input,
(i) the first bearing plate applies a first lateral load to the first section of the side of the excavation;
(ii) the second bearing plate applies a second lateral load to the second section of the side of the excavation, and
(iii) the piston extends from the chamber by displacement, 2y,
wherein the first lateral load has a first load magnitude and is in a first load direction, wherein the second lateral load has a second load magnitude and is in a second load direction, wherein the second load magnitude is the same as the first load magnitude, wherein the second load direction is opposite the first load direction,
wherein the loading mechanism is positioned within the excavation in the loading orientation,
inputting pressurized hydraulic fluid to the hydraulic fluid input such that the first lateral load and the second lateral load are applied.

20. A method of modeling pile response to lateral loading, comprising:
performing the method of claim 19;
further comprising:
determining a first lateral soil stiffness of the first section of the side of the excavation and a second lateral soil stiffness of the second section of the side of the excavation; and
using the lateral soil stiffness of the first section of the side of the excavation and the second section of the side of the excavation to model pile response to lateral loading applied to a head of a pile cast is an excavation similar to the excavation.

* * * * *